United States Patent
Huttemann et al.

(10) Patent No.: US 6,703,666 B1
(45) Date of Patent: Mar. 9, 2004

(54) THIN FILM RESISTOR DEVICE AND A METHOD OF MANUFACTURE THEREFOR

(75) Inventors: Robert D. Huttemann, Macungie, PA (US); George J. Terefenko, Mohnton, PA (US)

(73) Assignee: Agere Systems Inc., Allentown, PA (US)

( * ) Notice: Subject to any disclaimer, the term of this patent is extended or adjusted under 35 U.S.C. 154(b) by 83 days.

(21) Appl. No.: 09/614,992

(22) Filed: Jul. 12, 2000

Related U.S. Application Data
(60) Provisional application No. 60/143,691, filed on Jul. 14, 1999.

(51) Int. Cl.$^7$ .............................................. H01L 23/62
(52) U.S. Cl. ........................ 257/359; 257/383; 257/536; 438/384; 438/382
(58) Field of Search ................................ 257/359, 536, 257/581, 164, 350, 380, 516, 577, 537, 538, 358, 904, 383; 438/171, 190, 238, 329, 330, 382–385

(56) References Cited

U.S. PATENT DOCUMENTS

| | | | |
|---|---|---|---|
| 3,400,066 A | * 9/1968 | Caswell et al. | ............. 257/536 |
| 3,849,757 A | * 11/1974 | Khammous et al. | ........ 338/320 |
| 4,325,048 A | 4/1982 | Zaghi et al. | |
| 4,344,223 A | 8/1982 | Bulger et al. | |
| 4,742,325 A | 5/1988 | Muller et al. | |
| 4,975,386 A | 12/1990 | Rao | |
| 5,024,966 A | 6/1991 | Dietric et al. | |
| 5,030,588 A | 7/1991 | Hosaka | |
| 5,304,802 A | * 4/1994 | Kumagai | .................... 257/328 |
| 5,310,694 A | 5/1994 | Houston | |
| 5,310,695 A | 5/1994 | Suzuki | |
| 5,340,775 A | 8/1994 | Carruthers et al. | |
| 5,959,343 A | * 9/1999 | Harada et al. | ............. 257/528 |
| 5,989,970 A | * 11/1999 | Ohkawa et al. | ............ 438/384 |
| 6,165,862 A | * 12/2000 | Ishikawa et al. | ............ 438/384 |
| 6,194,775 B1 | * 2/2001 | Usami | ........................ 257/536 |
| 6,225,183 B1 | * 5/2001 | Lee | ............................. 438/384 |
| 6,242,792 B1 | * 6/2001 | Miura et al. | ................ 257/536 |
| 6,326,256 B1 | * 12/2001 | Bailey et al. | ............... 438/238 |
| 6,365,482 B1 | * 4/2002 | Maghsoudnia | ............. 438/384 |
| 2002/0102806 A1 | * 8/2002 | Bailey et al. | ............... 438/384 |

FOREIGN PATENT DOCUMENTS

| | | | |
|---|---|---|---|
| DE | 197 48 847 A1 | 5/1998 | |
| JP | 56-80152 | * 7/1981 | ................. 257/537 |
| JP | 57-23256 | * 6/1982 | ................. 257/537 |
| JP | 62-35565 | * 2/1987 | ................. 257/538 |
| JP | 64-2345 | * 1/1989 | ................. 257/538 |
| JP | 01291401 | 11/1989 | |
| JP | 02-205065 | * 8/1990 | ................. 257/538 |
| JP | 11-87264 | 3/1999 | |

* cited by examiner

*Primary Examiner*—Eddie Lee
*Assistant Examiner*—Douglas W. Owens

(57) ABSTRACT

The present invention provides a thin film resistor and method of manufacture therefor. The thin film resistor comprises a resistive layer located on a first dielectric layer, first and second contact pads located on the resistive layer, and a second dielectric layer located over the resistive layer and the first and second contact pads. In an illustrative embodiment, the thin film resistor further includes a first interconnect that contacts the first contact pad and a second interconnect that contacts the second contact pad.

28 Claims, 16 Drawing Sheets

THIN FILM RESISTOR DEVICE AND A METHOD OF MANUFACTURE THEREFOR

CROSS-REFERENCE TO PROVISIONAL APPLICATION

This application claims the benefit of U.S. Provisional Application No. 60/143,691 entitled "BURIED IN GLASS SILICON TANTALUM INTEGRATED CIRCUITS (BIG STIC)," to Robert D. Huttemann, et al., filed on Jul. 14, 1999, which is commonly assigned with the present invention and incorporated herein by reference as if reproduced herein in its entirety.

TECHNICAL FIELD OF THE INVENTION

The present invention is directed, in general, to integrated circuits and, more specifically, to buried thin film resistors, and a method of manufacture therefor.

BACKGROUND OF THE INVENTION

The semiconductor manufacturing industry is continually striving to manufacture smaller, faster and more reliable semiconductor devices. At the present time, hybrid integrated circuits are used in a number of application requiring precision circuit operation. Such circuits are typically fabricated by forming thin film resistors, interconnect metals, and bonding pads on an insulating substrate. Presently resistors are typically defined by a layer of tantalum nitride. In such instances, gold and similar interconnect materials have been used to form the interconnects to these resistors. However, fabrication of these resistors may be problematic.

For example, in its efforts to develop smaller, faster and more reliable semiconductor devices, the semiconductor manufacturing industry has looked for other interconnect structures than those based on gold. For instance, aluminum interconnects have been seen as viable, faster and more reliable alternatives.

The incorporation of thin film resistors into present day integrated circuits poses a substantial problem because of the extensive use of aluminum as the choice interconnect material. The major problem of incorporating a thin film resistor into an integrated circuit employing aluminum interconnects lies in the incompatibility of the material from which the thin film resistor is made with the etching chemistry used to form the aluminum interconnects. More specifically, the etching chemistry can attack the resistor material and either destroy the resistor altogether or significantly degrade the resistor's reliability. For example, traditional thin film resistor devices are not compatible with chemistries including hydrogen chloride, hydrogen fluoride or other fluorine containing chemicals, oxygen plasma, some photoresist strippers and many more similar chemistries. As is well known, aluminum is often patterned using a dry plasma etch, which negatively affects the thin film resistor device. Thus, without specifically constructing semiconductor manufacturing tools compatible with gold interconnects or redesigning the traditional thin film resistor devices, reliability problems will continue to exist when trying to incorporate a thin film resistor into an integrated circuit formed with aluminum interconnects.

Accordingly, what is needed in the art is a thin film resistor device that is adapted to accept the change from gold and copper interconnects to aluminum interconnects, and does not experience the reliability issues experienced when combining the prior art thin film resistors and aluminum interconnect structures.

SUMMARY OF THE INVENTION

In an illustrative embodiment a thin film resistor comprises a resistive layer located on a first dielectric layer, first and second contact pads located on the resistive layer, and a second dielectric layer located over the resistive layer and the first and second contact pads. In an illustrative embodiment, the thin film resistor further includes a first interconnect that contacts the first contact pad and a second interconnect that contacts the second contact pad.

Provided in another aspect of the present invention is a method of manufacturing the thin film resistor device. The method in an illustrative embodiment includes: (1) forming a resistive layer on a first dielectric layer, (2) forming first and second contact pads on the resistive layer, and (3) forming a second dielectric layer over the resistive layer and the first and second contact pads.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

The invention is best understood from the following detailed description when read with the accompanying FIGS. It is emphasized that in accordance with the standard practice in the semiconductor industry, various features are not drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

Figure 1:
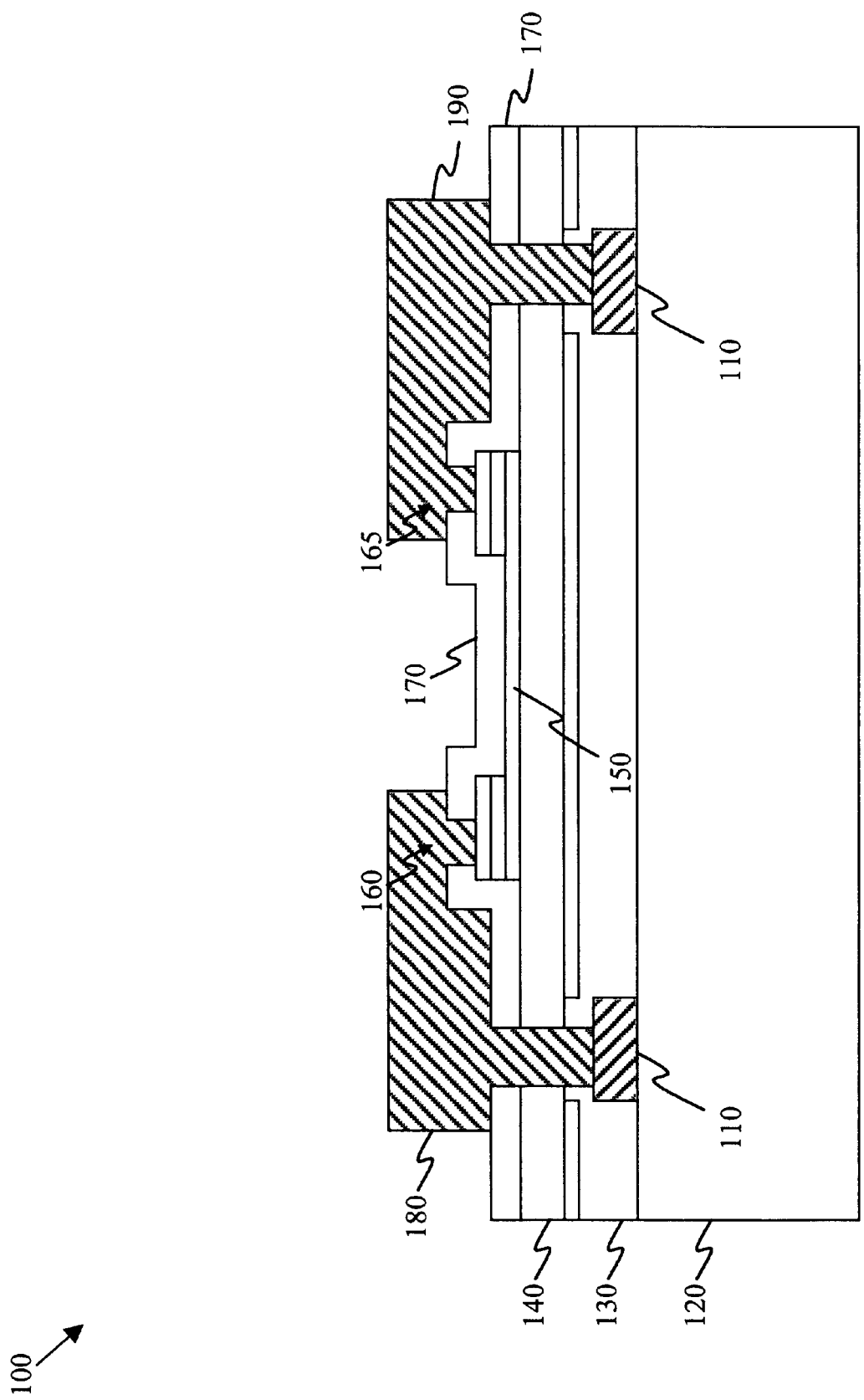
FIG. 1 illustrates one embodiment of a completed thin film resistor device as covered by the present invention.

Referring initially to FIG. 1, illustrated is an exemplary embodiment of a completed thin film resistor device 100, which may be manufactured according to the method described below. In the illustrative embodiment shown in FIG. 1, the thin film resistor device 100 contains interconnect metallization structures 110, formed on a substrate 120. The substrate 120 may be any layer in a semiconductor device, including a layer located at wafer level or a layer located above wafer level. In an illustrative embodiment, the substrate may be an interlevel dielectric layer formed over traditional transistor devices. Also located on the substrate 120, separating the metallization structures 110, is an interconnect metallization structure layer 130.

The completed thin film resistor device 100 also contains a first dielectric layer 140 formed over the interconnect metallization structure layer 130 and interconnect metallization structures 110. The first dielectric layer 140, may be further located between the interconnect metallization structures 110 and a resistive layer 150. The resistive layer 150 forms an integral part of the completed thin film resistor device 100. The resistive layer 150 has a first contact pad 160 and second contact pad 165 located thereon. As illustrated, the first and second contact pads 160, 165, may be located on opposing ends of the resistive layer 150. Moreover, the contact pads 160, 165, in an exemplary embodiment, comprise a stack of one or more metals.

Located on the resistive layer 150 and a portion of the contact pads 160, 165, may be a second dielectric layer 170. The second dielectric layer 170 may comprise a similar material to the first dielectric layer 140 and furthermore allows the completed thin film resistor device 100 to be used with aluminum interconnects. Also illustrated in FIG. 1 is a first interconnect 180 that contacts the first contact pad 160, and a second interconnect 190 that contacts the second contact pad 165.

The completed thin film resistor device 100, as illustrated in FIG. 1, allows for the integration of such thin film resistors with aluminum interconnects, which are currently widely used in today's technology. More specifically, the presence of the second dielectric layer 170, formed prior to formation of the first and second interconnects 180, 190, and vias for the first and second interconnects 180, 190, prevents the etch processes associated with the interconnects 180, 190, and vias, from damaging the resistive layer 150. Moreover, the completed thin film resistor device 100 can be easily manufactured using current manufacturing tools while retaining the same resistor reliability as exhibited in prior art resistors, may be laser trimmable like the prior art resistors and may be generally invisible to the consumer, i.e., no changes to the consumer end tailoring process are required.

Figure 2:
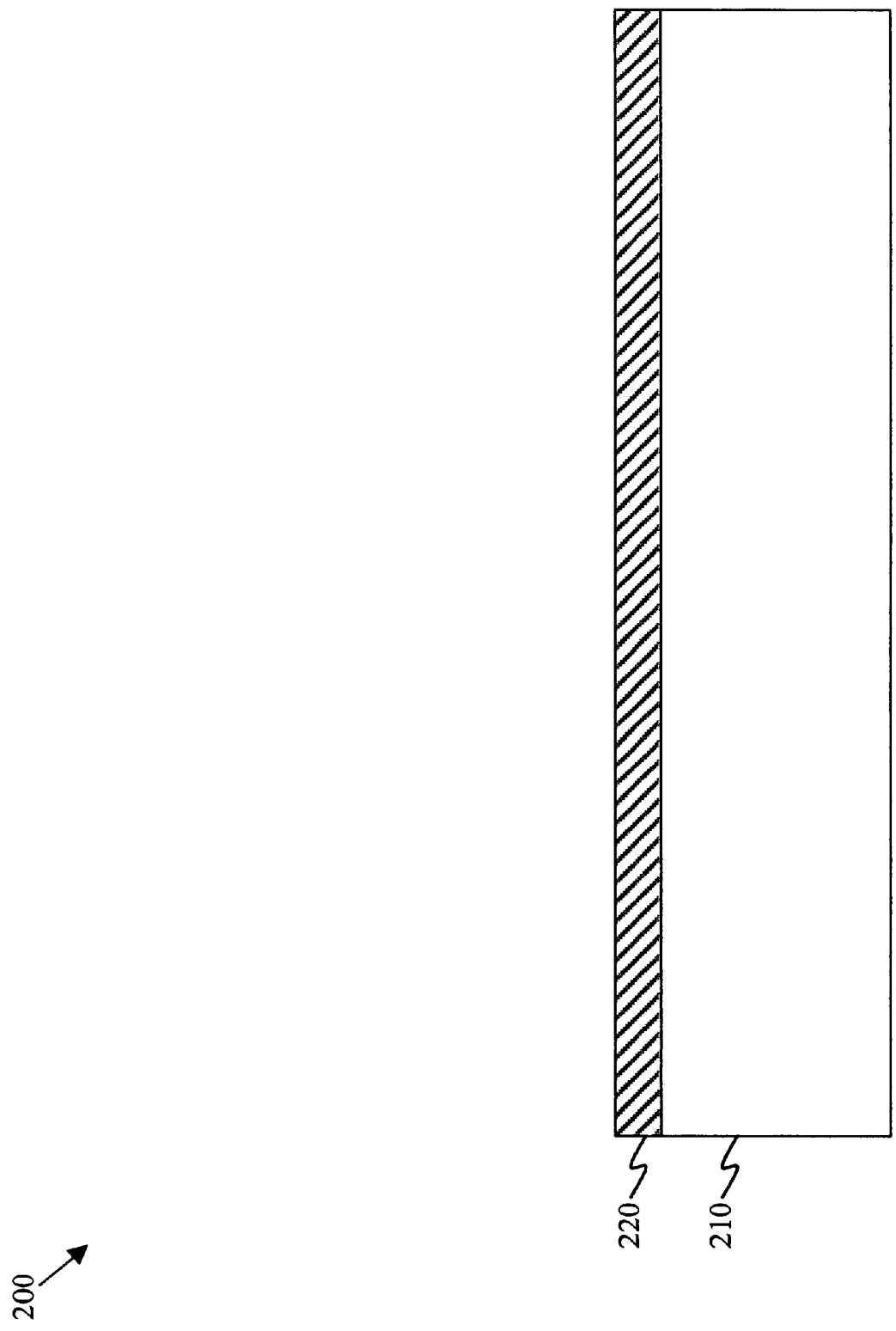
FIG. 2 illustrates the formation of an interconnect metallization structure layer over a substrate.

Turning to FIGS. 2–15, with continued reference to FIG. 1, illustrated are detailed manufacturing steps instructing how one might, in an exemplary embodiment, manufacture the completed thin film resistor device 100 depicted in FIG. 1. Turning initially to FIG. 2, illustrated is a partially completed thin film resistor device 200 after the deposition of an interconnect metallization structure layer 220 over a substrate 210. As mentioned above, in a preferred embodiment, the substrate 210 may be the lowest interlevel dielectric layer located over a transistor device, and in an exemplary embodiment is silicon oxy-nitride. The interconnect metallization structure layer 220 may be conventionally formed. For example, a physical vapor deposition (PVD) process, chemical vapor deposition (CVD) process or other similar deposition process, may be used to form the interconnect metallization structure layer 220. In a preferred embodiment associated with the present invention, the interconnect metallization structure layer 220 is an aluminum layer. However, one skilled in the art knows that other materials could comprise the interconnect metallization structure layer 220.

Figure 3:
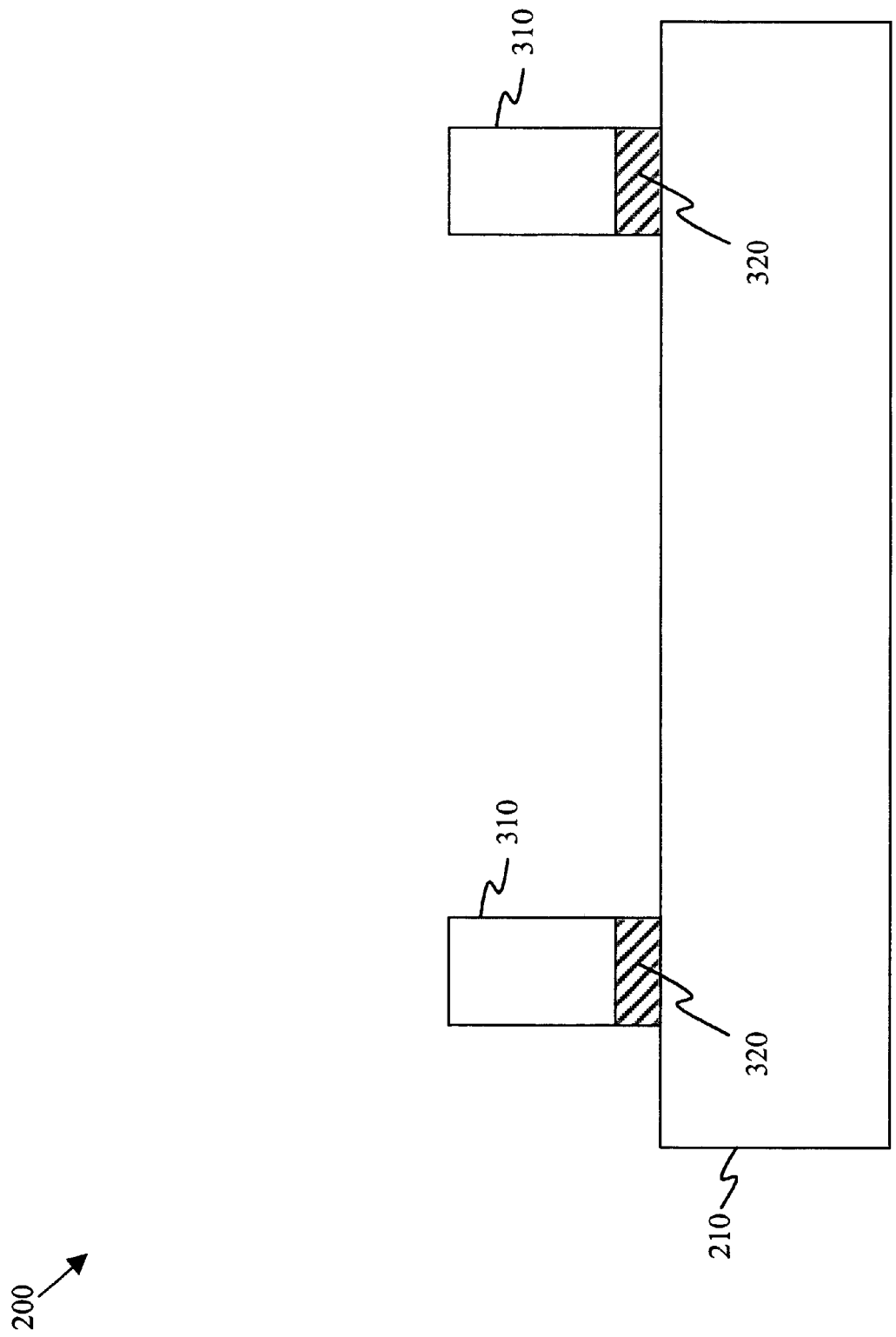
FIG. 3 illustrates the formation of interconnect metallization structures.

Following its deposition, the interconnect metallization structure layer 220 is conventionally patterned, using photoresist portions 310, as illustrated in FIG. 3. After formation of the photoresist portions 310, the unprotected interconnect metallization structure layer 220 is subjected to a traditional metal etch. In one exemplary embodiment, a dry plasma etch may be used to remove the unprotected interconnect metallization structure layer 220 (FIG. 2); however other similar etch processes could be used to remove the unprotected interconnect layer 220, if compatible with the design of the device. After completion of the etch, the photoresist is removed, resulting in interconnect metallization structures 320. As will be discussed in more detail in the last figure, the interconnect metallization structures 320, in a preferred embodiment, may contact transistor devices of a completed integrated circuit.

Figure 4:
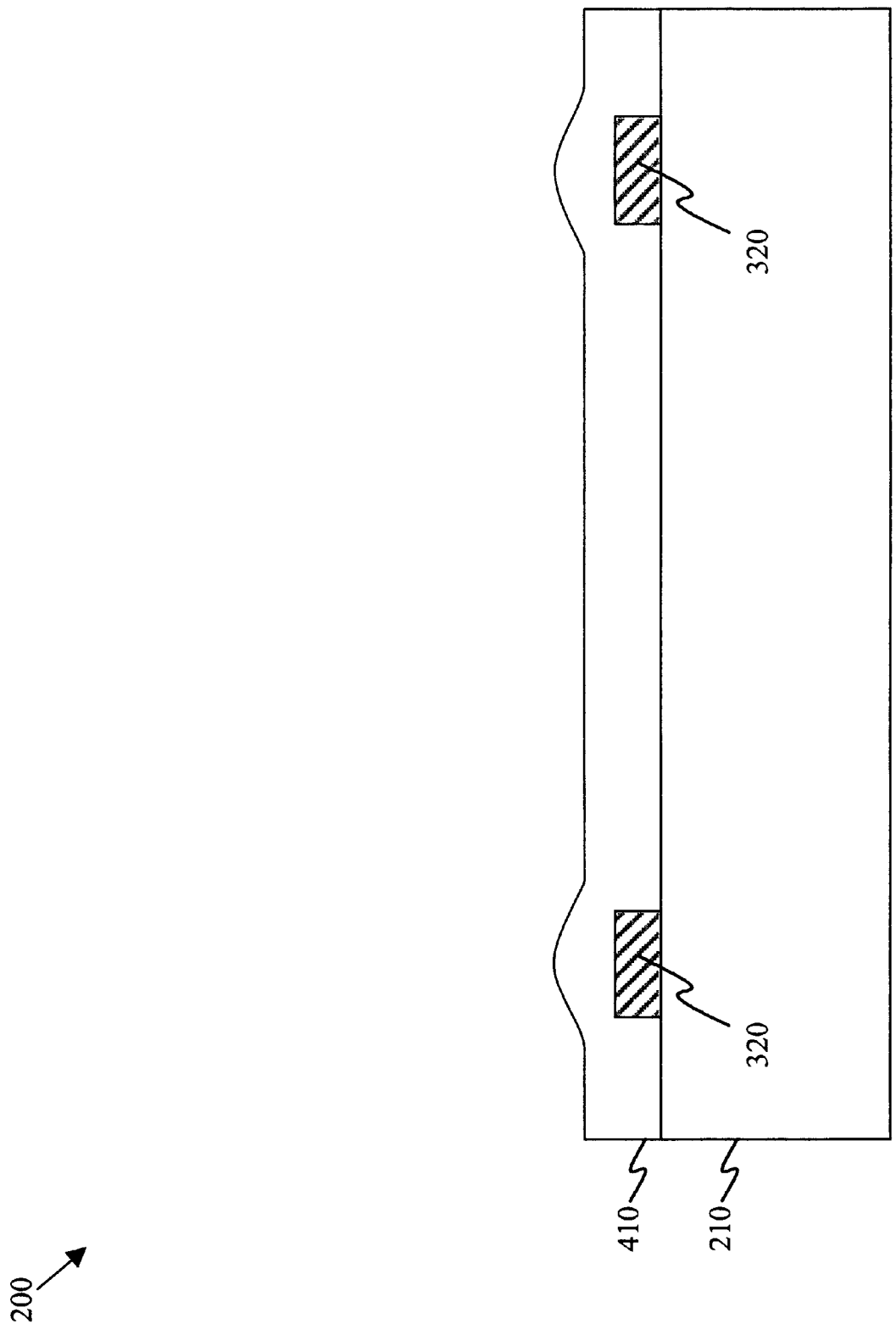
FIG. 4 illustrates the formation of a conformal dielectric layer over the interconnect metallization structures and substrate.
Figure 5:
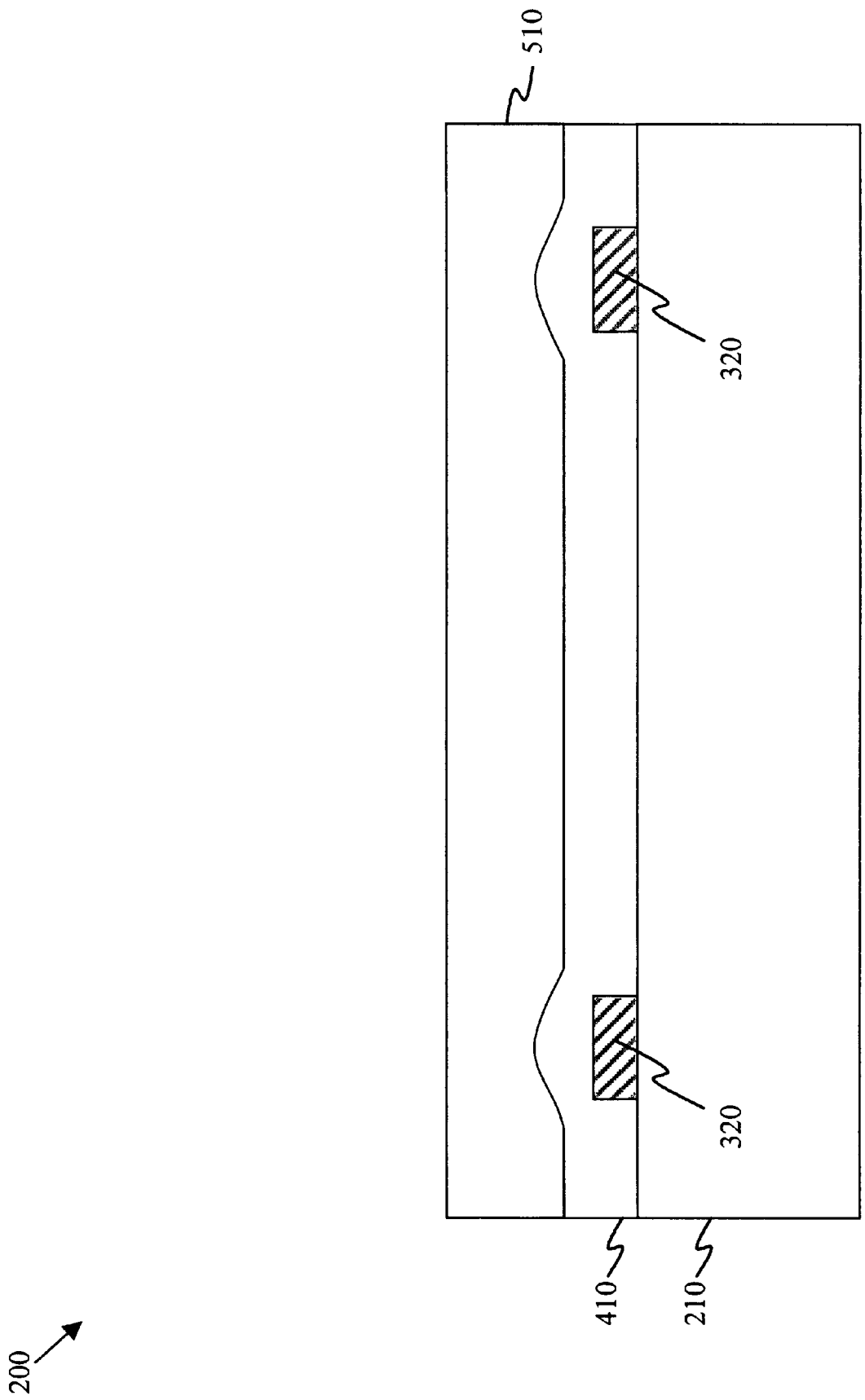
FIG. 5 illustrates the formation of a thin layer of dielectric material over the conformal dielectric layer.

Turning to FIG. 4, illustrated is the formation of a dielectric layer 410 over the interconnect metallization structures 320 and substrate 210. Typically, the dielectric layer 410 is conformally deposited using a traditional plasma enhanced chemical vapor deposition (PECVD) process, resulting in the dielectric layer 410 shown. In one illustrative embodiment of the invention, the dielectric layer 410 is a silicon oxy-nitride dielectric layer and may be deposited to a thickness greater than the thickness of the interconnect metallization structures 320. One having skill in the art knows that the deposition process is not limited to a PECVD process and that other deposition processes within the scope of the present invention could be used. In general, the substrate upon which the completed thin film resistor 100 (FIG. 1) is formed should be substantially planar. Thus, as illustrated in FIG. 5, a thin layer of dielectric material 510, for example spin on glass (SOG)in a preferred embodiment, may be conventionally deposited over the conformal dielectric layer 410.

Figure 6:
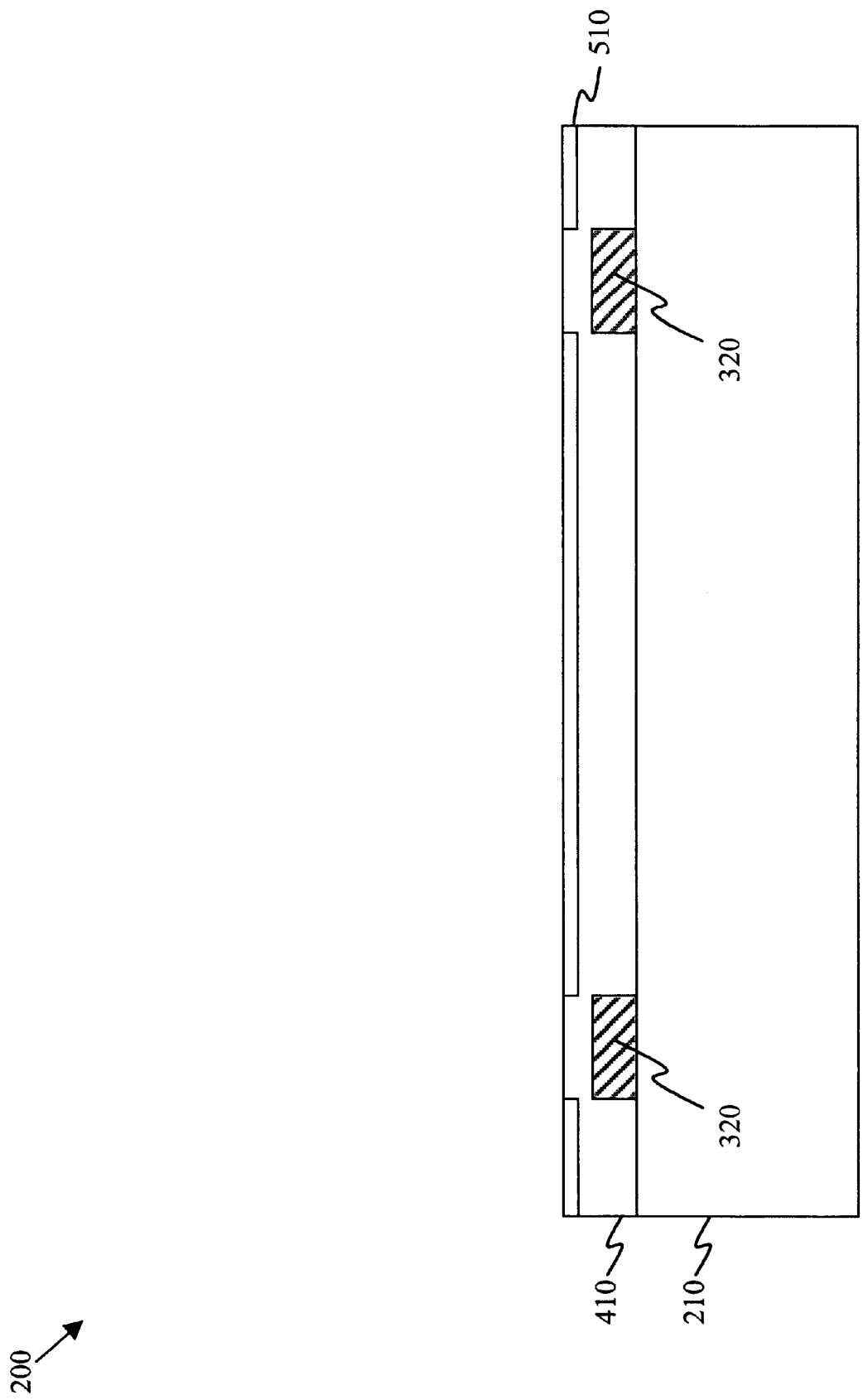
FIG. 6 illustrates the planarization of the thin layer of dielectric layer and the conformal dielectric layer.

After formation of the thin layer of dielectric material 510 over the dielectric layer 410, a conventional chemical mechanical planarization (CMP) process, or other similar process, can be used to smooth the thin layer of dielectric material 510 and dielectric layer 410, resulting in the partially completed thin film resistor device 200 as illustrated in FIG. 6. Care should be taken during the smoothing process to assure that the interconnect metallization structures 320 have a thin layer of the dielectric layer 410 remaining over them, while at the same time assuring that no dielectric material 510 remains on the interconnect metallization structures 320. As illustrated, the surface of the partially completed thin film resistor device 200 illustrated in FIG. 6, is substantially smooth.

Figure 7:
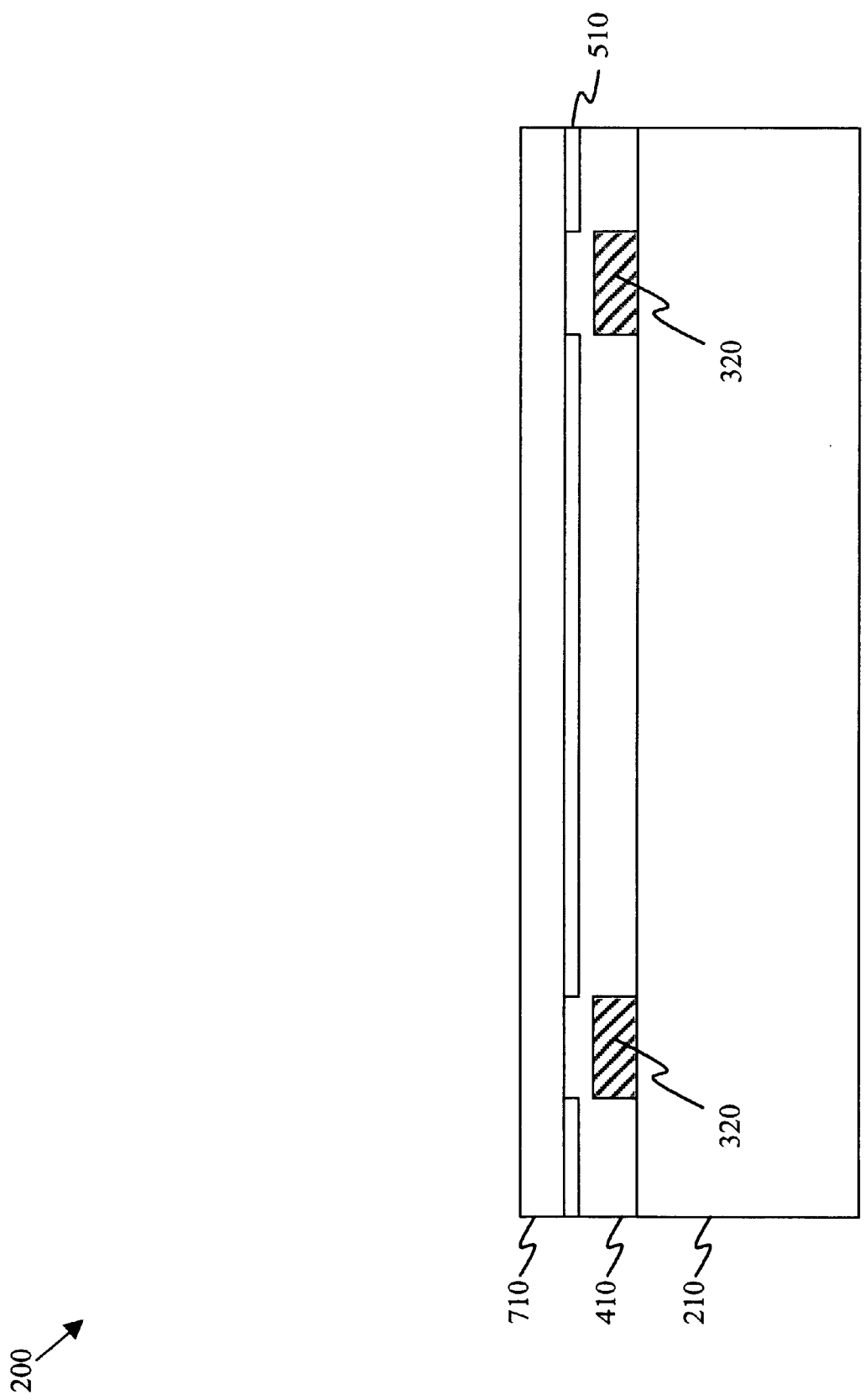
FIG. 7 illustrates the partially completed thin film resistor device illustrated in FIG. 6, after the formation of a first dielectric layer.

Turning to FIG. 7, illustrated is the partially completed thin film resistor device 200 illustrated in FIG. 6, after the formation of a first dielectric layer 710. The first dielectric layer 710, in an exemplary embodiment, may be deposited to prevent any exposed portions of the thin layer of dielectric material 510, especially SOG, from contacting a resistive layer, formed in FIG. 8. In an illustrative embodiment, the first dielectric layer 710 has a thickness similar to that of the as deposited dielectric layer 410, for example a thickness of about 1200 nm.

Figure 8:
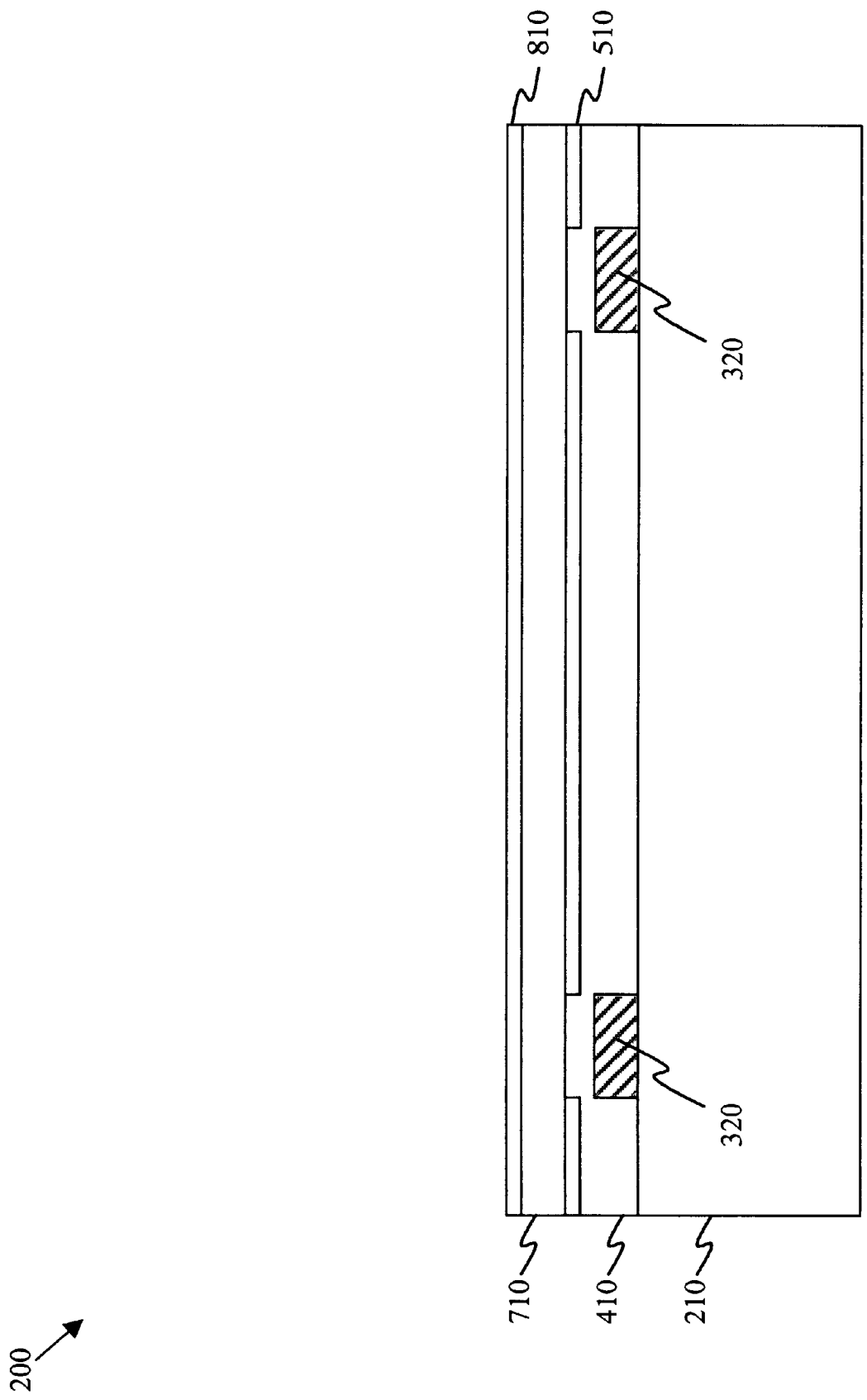
FIG. 8 illustrates the formation of a resistive material layer.

Turning to FIG. 8, illustrated is the formation of a resistive material layer 810. The resistive material layer 810, in an exemplary embodiment, is a tantalum nitride ($Ta_2N$) resistive layer having a thickness ranging from about 20 nm to about 80 nm. However, nickel chromium (NiCr) or other similar resistive materials may be used. Typically, the resistive material layer 810 may be formed using a sputtering process. The sputtering process may be performed using a tantalum target sputtered in the presence of nitrogen gas and argon gas. However, one having skill in the art knows that the resistive material layer 810 may be formed using other processes known to those skilled in the art. In the exemplary embodiment where the tantalum nitride resistive layer is formed, the tantalum nitride resistive layer may be slightly under nitrided. In such embodiments, the nitrogen concentration may ranges from about 23 atomic percent to about 26 atomic percent. Moreover, the tantalum nitride resistive layer, in an illustrative embodiment, may have a tetragonal crystal structure. Even though specifics have been given with respect to the tantalum nitride resistive layer, one having skill in the art understands that the resistive layer 810 is not limited to a tantalum nitride resistive layer, and that other materials, such as those listed above, could comprise the resistive material layer 810.

Prior to forming the resistive material layer 810, in an exemplary embodiment, the surface of the first dielectric layer 710 may be subjected to a wet chemical clean comprising $NH_4OH/H_2O_2$, followed by a plasma oxidation for about 60 minutes at 300 watts. In the same exemplary embodiment, the plasma oxidation may be followed by a second wet clean chemistry similar to that used for the first wet chemical clean. One skilled in the art knows that the process of cleaning and plasma oxidizing the first dielectric layer 710, is only an exemplary embodiment and is not required.

Figure 9:
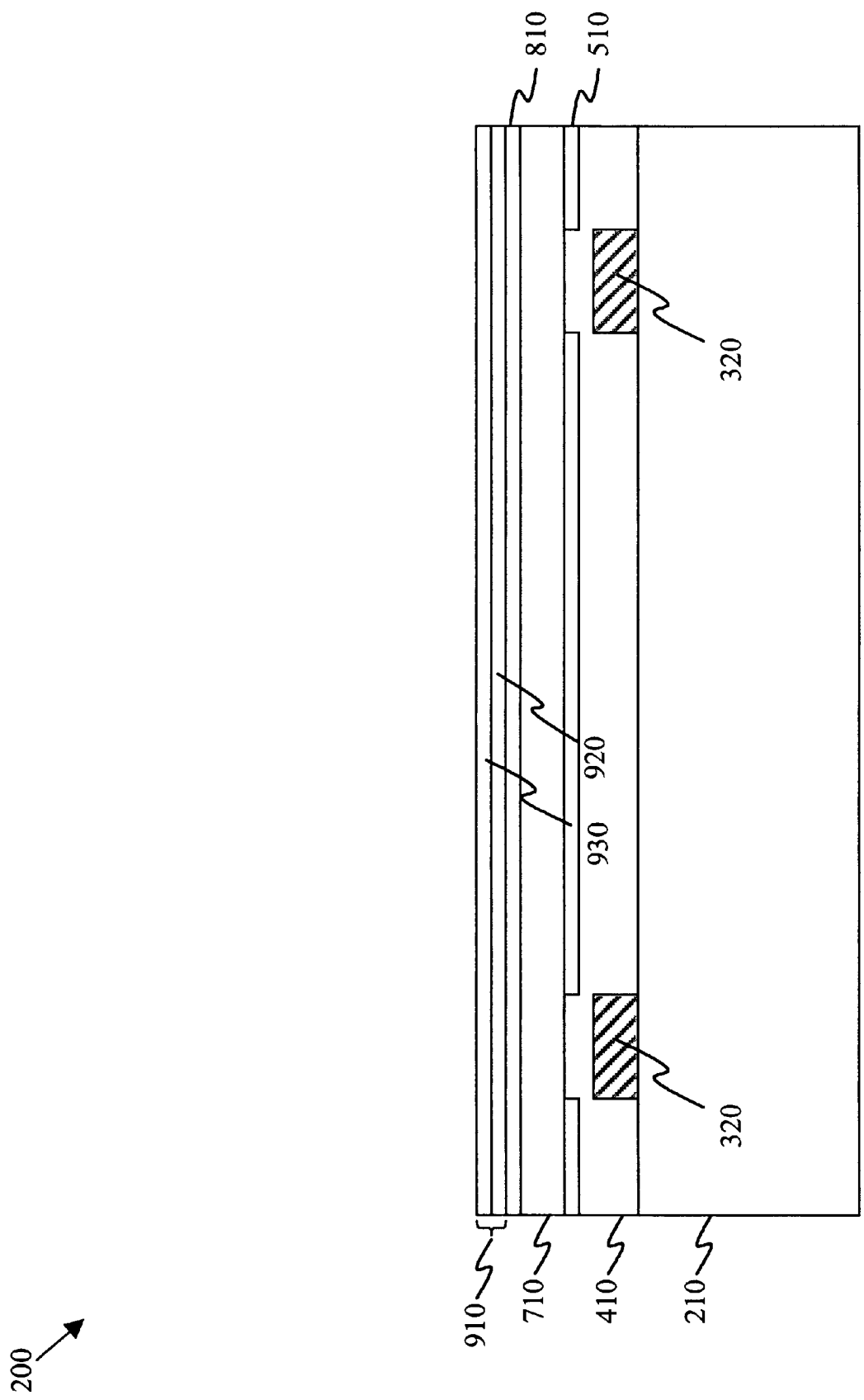
FIG. 9 illustrates the partially completed thin film resistor device illustrated in FIG. 8, after formation of a contact pad layer.

Turning to FIG. 9, illustrated is the partially completed thin film resistor device 200 illustrated in FIG. 8, after formation of a contact pad layer 910. The contact pad layer 910, in an illustrative embodiment, is a stack layer comprising a titanium layer 920 and a platinum layer 930. However, in a more illustrative embodiment, the contact pad layer 910 comprises a titanium layer having a thickness of about 100 nm, a titanium nitride layer having a thickness of about 7.5 nm and a platinum layer having a thickness of about 200 nm. The contact pad layer 910 may be formed using conventional PVD or other similar processes. Prior to forming the contact pad layer 910, in an optional illustrative embodiment, a nitric-sulfuric clean of the resistive layer 810 could be conducted at about 85° C. for 10 minutes.

Figure 10:
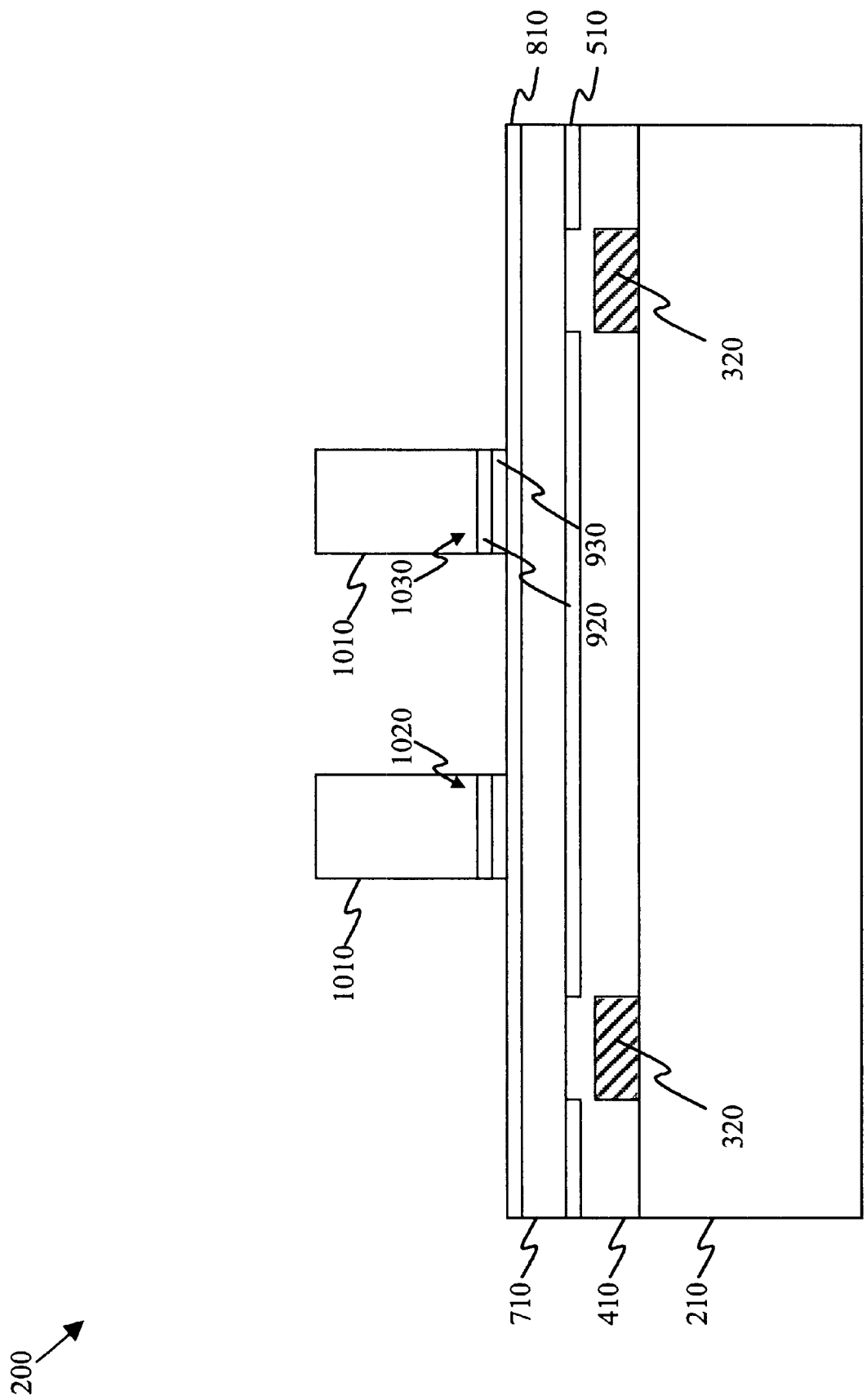
FIG. 10 illustrates the formation of a first contact pad and a second contact pad on the resistive material layer.

After completion of the contact pad layer 910, a layer of photoresist may be deposited, patterned and developed resulting in photoresist portions 1010, illustrated in FIG. 10. After formation of the photoresist portions 1010 over an area where the contact pad layer 910 is to remain, the partially completed thin film resistor device 200 may be subjected to an etching process, resulting in the first contact pad 1020 and second contact pad 1030, located on the resistive material layer 810. As discussed in more detail below, the first and second contact pads 1020, 1030, should have a width about 3000 nm wider than the via that contacts them.

In an exemplary embodiment, portions of the platinum layer 930 and the titanium layer 920 are removed using separate etchant mixtures from one another. For example, the platinum layer 930 may be etched in aqua regia, i.e., a 4:3:1 solution of water, hydrochloric acid and nitric acid, for about 8 minutes at about 75° C., and the titanium layer 920 may be etched in a solution of sulfuric acid, for about 2.5 minutes at about 125° C. It should be noted that separate etching steps are not required, and a single etching step could be used if it were consistent with the design of the device. If the titanium nitride layer were used, as discussed above, it would also need to be etched using a similar process to the platinum layer 930 and titanium layer 920. In the illustrative embodiment, after completing the etch of the platinum layer 930 and titanium layer 920, the photoresist portions 1010 should be removed.

Figure 11:
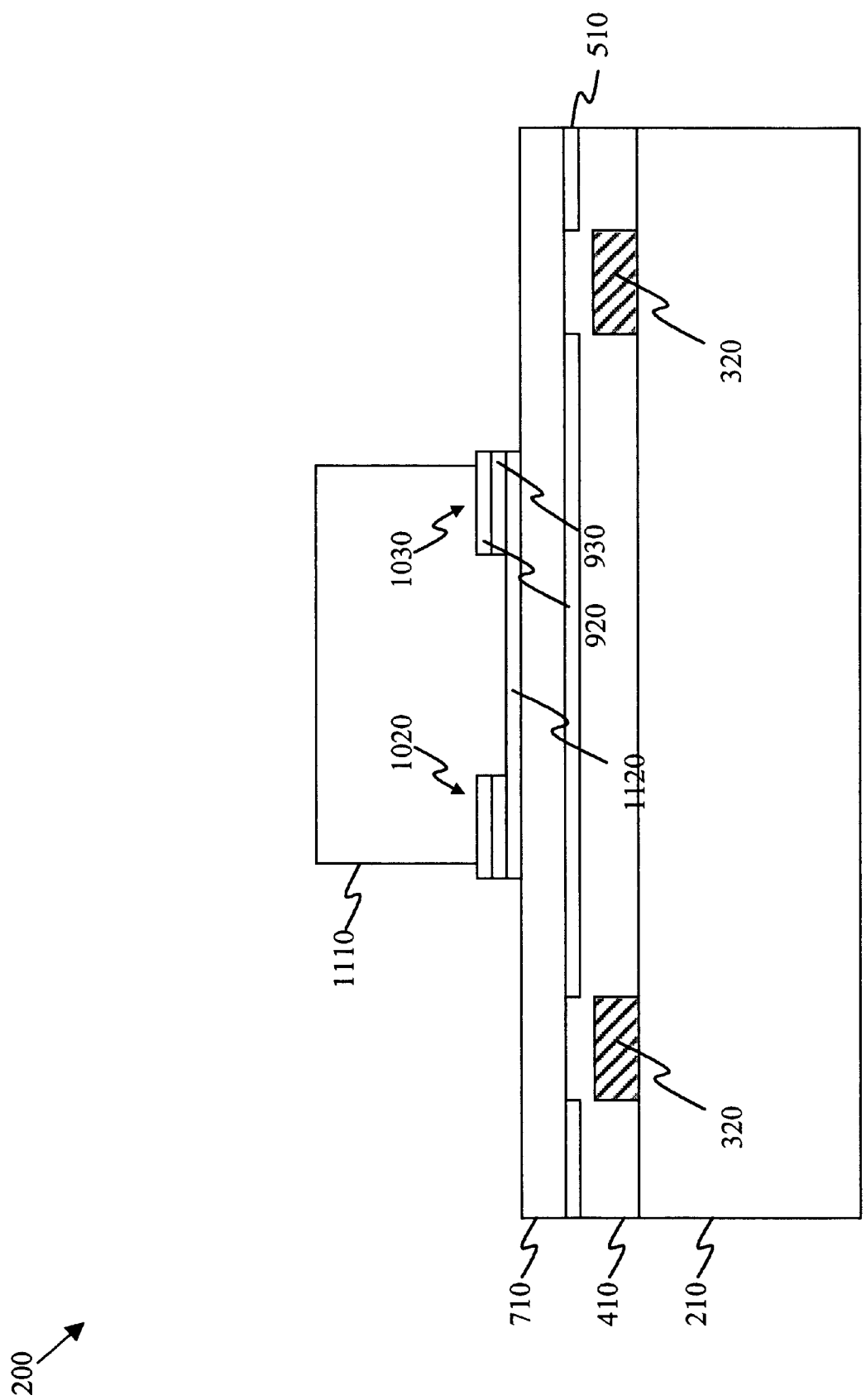
FIG. 11 illustrates the etching of the resistive material layer.

Turning to FIG. 11, illustrated is the etching of the resistive material layer 810 (FIG. 8). To etch the resistive material layer 810, initially a layer of photoresist may be deposited, patterned within the bounds of the contact pads 1020, 1030 for the purpose of self alignment, and developed leaving photoresist portions 1110 to protect a portion of the resistive material layer 810. In the completed device, the resistive material layer 810 will comprise the thin film resistor. After formation of the photoresist portion 1110, the partially completed thin film resistor device 200 may be subjected to an etch process. In an exemplary embodiment the etch may be conducted by placing the partially completed thin film resistor device 200 within a plasma etcher, for example a Matrix 303 downstream etcher, and removing those areas not protected by the photoresist portion 1110 or the contact pads 1020, 1030, resulting in a resistive layer 1120.

After completion of the resistive layer 1120, in an illustrative embodiment, the partially completed thin film resistor device 200, may undergo a stabilization process. For example, the resistive layer 1120 may be subjected to a temperature of about 325° C. for about 16 hours in air, for a grain boundary stuffing with oxygen. This, in an exemplary embodiment, converts about 5 nm to about 10 nm of the tantalum nitride to tantalum pentoxide ($Ta_2O_5$). One having skill in the art understands that this may be only an optional step, and is not required for the completed thin film resistor device 100 (FIG. 1) to functionally operate.

Figure 12:
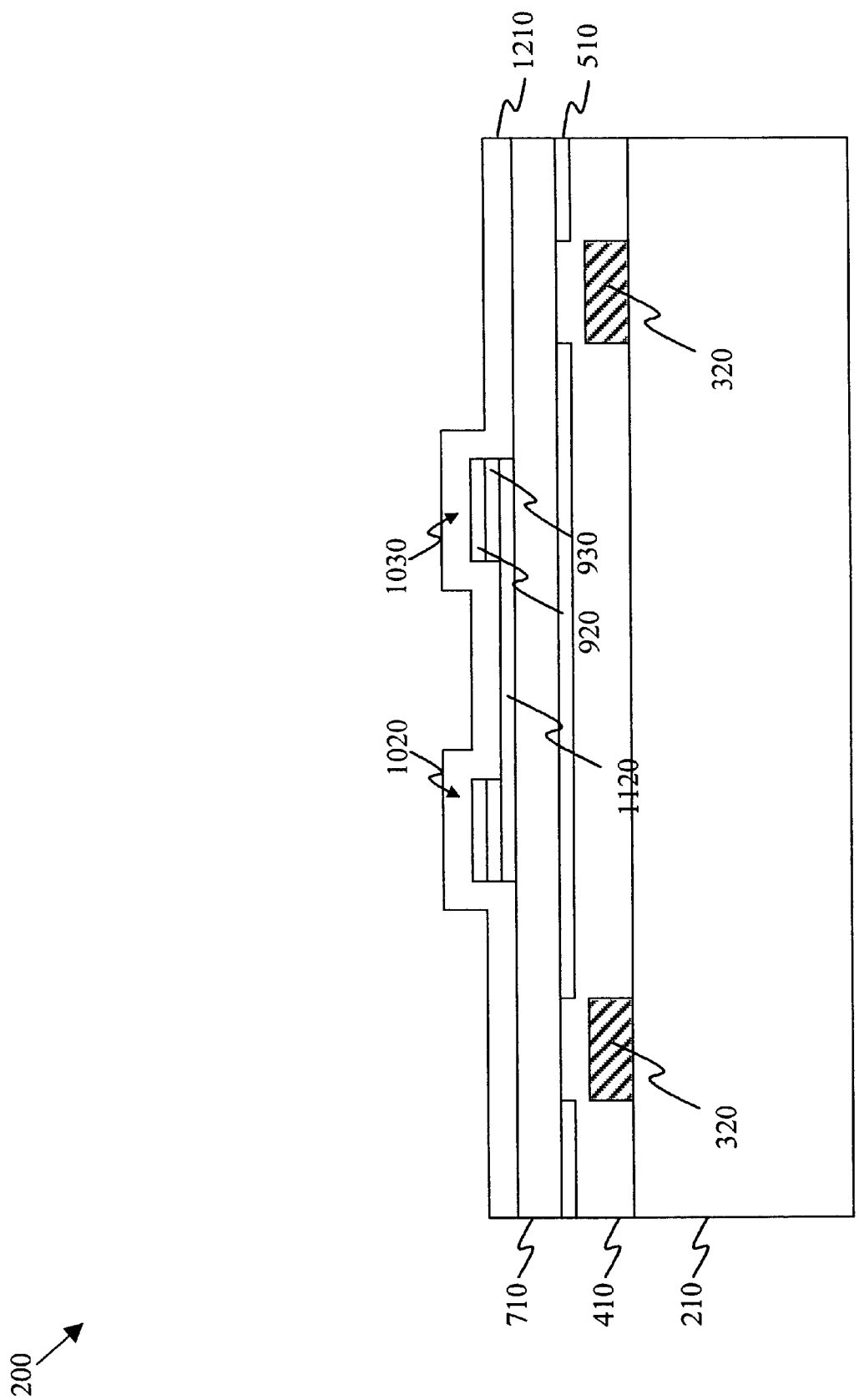
FIG. 12 illustrates a conformal deposition of a second dielectric layer over the first contact pad, the second contact pad, the resistive layer and the first dielectric layer.

Turning to FIG. 12, illustrated is a conformal deposition of a second dielectric layer 1210 over the first contact pad 1020, the second contact pad 1030, the resistive layer 1120 and the first dielectric layer 710. The second dielectric layer 1210 may comprise a similar material to the first dielectric layer 710, for example silicon oxy-nitride. Moreover, the second dielectric layer 1210 may have a thickness ranging from about 240 nm to about 600 nm and may be deposited using a conventional CVD or other similar process. The second dielectric layer 1210 substantially isolates the resistive layer 1120 from subsequent processing steps, for example the chemistries used for the formation of vias and interconnects.

Figure 13:
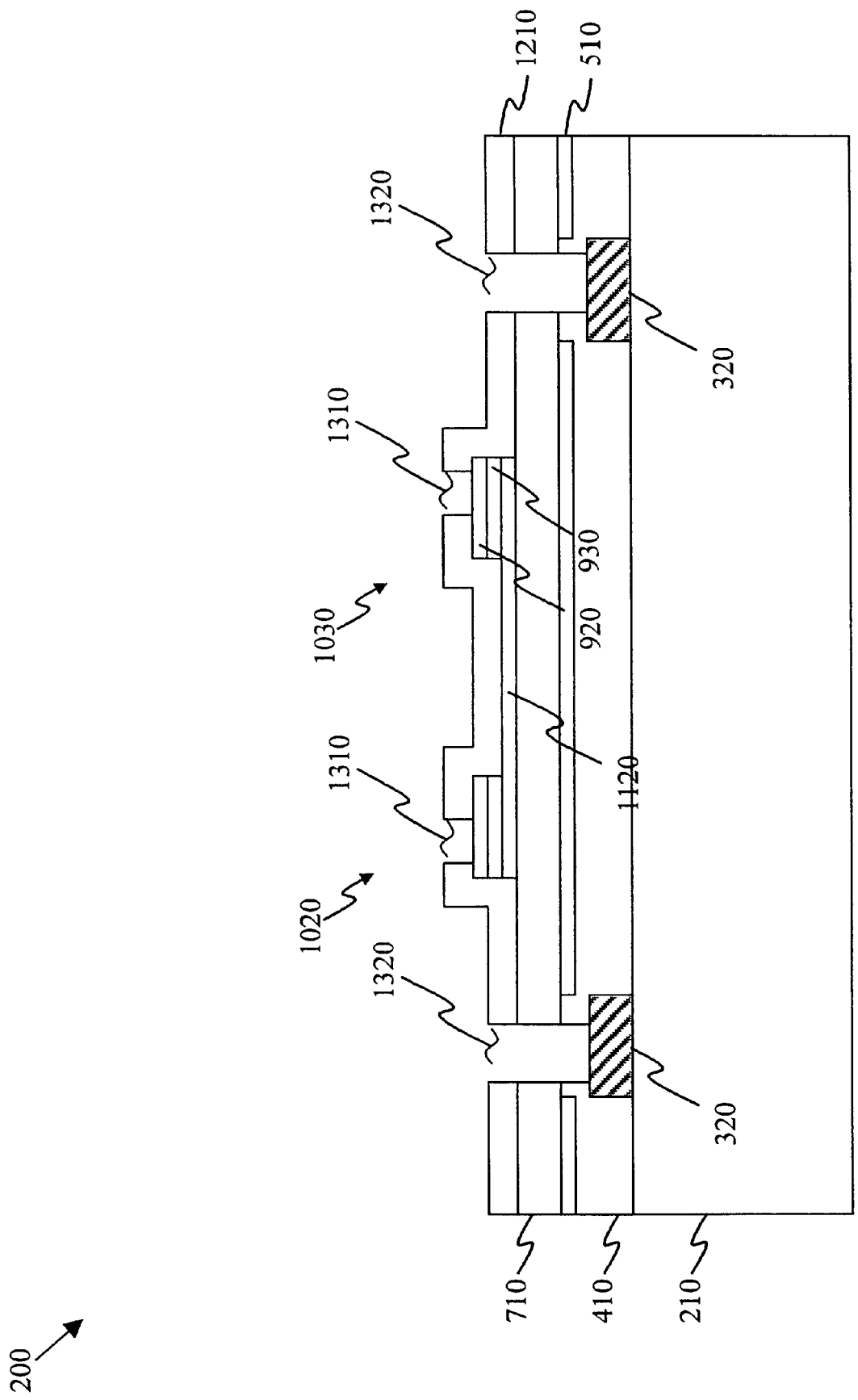
FIG. 13 illustrates the formation of contact pad vias or windows, and interconnect metallization structure vias or windows.
Figure 14:
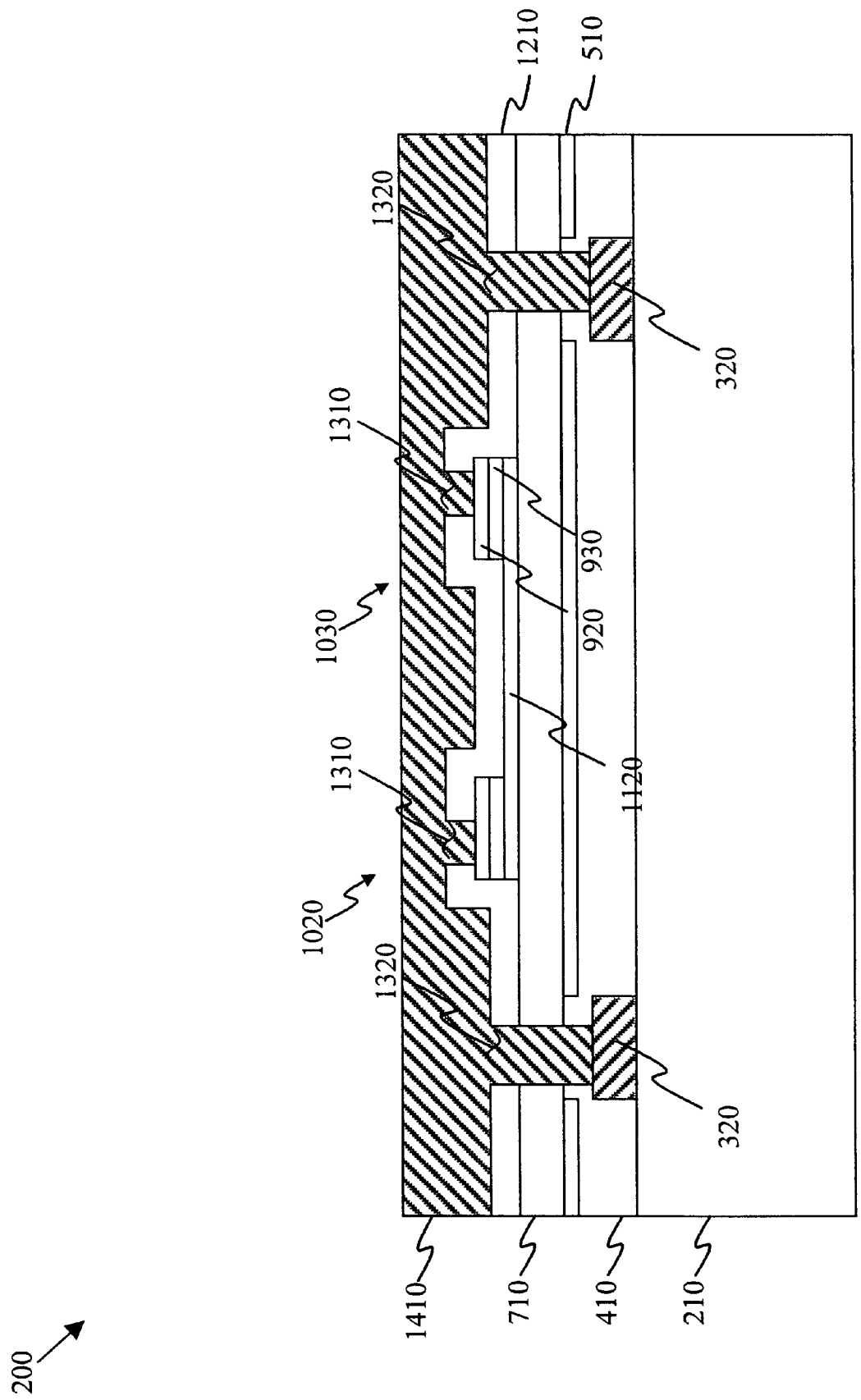
FIGS. 14A & 14B illustrate the formation of a blanket metal layer within the contact pad vias and interconnect metallization structure vias, and over the second dielectric layer.

Turning to FIG. 13, illustrated is the formation of contact pad vias or windows 1310 and interconnect metallization structure vias or windows 1320. In the illustrative embodiment, the contact pad vias 1310 are formed over and down to the first contact pad 1020 and second contact pad 1030, and the interconnect metallization structure vias 1320 are formed over and down to the interconnect metallization structures 320. In an exemplary embodiment, the contact pad vias 1310 and the interconnect metallization structure vias 1320 are formed simultaneously. However, the vias 1310, 1320, have different depths, and as such, pose a problem with the contact pad vias 1310 wallering out while the interconnect metallization structure vias 1320 continue to be formed. In an exemplary embodiment, determined by the width of the contact pad vias 1310, the first and second contact pads 1020, 1030 should have a width about 3000 nm wider than the contact pad vias 1310. As a result, the contact pad vias 1310, even if wallered out, will remain over the first and second contact pads 1020, 1030.

Turning to FIG. 14A, illustrated is the formation of a blanket metal layer 1410 within the contact pad vias 13 10 and interconnect metallization structure vias 1320, and over the second dielectric layer 1210. The blanket metal layer 1410 may be typically formed using a traditional PVD or CVD process, but other similar processes are within the scope of the present invention. The blanket metal layer 1410 in an exemplary embodiment may be an aluminum layer, however, in an alternative exemplary embodiment the blanket metal layer 1410 may be a titanium/titanium nitride/aluminum/titanium nitride stack 1410 B (See FIG. 14B). One having skill in the art knows that aluminum and its alloys are currently an interconnect metal of choice, nonetheless, other interconnect metals are also within the scope of the present invention.

Figure 15:
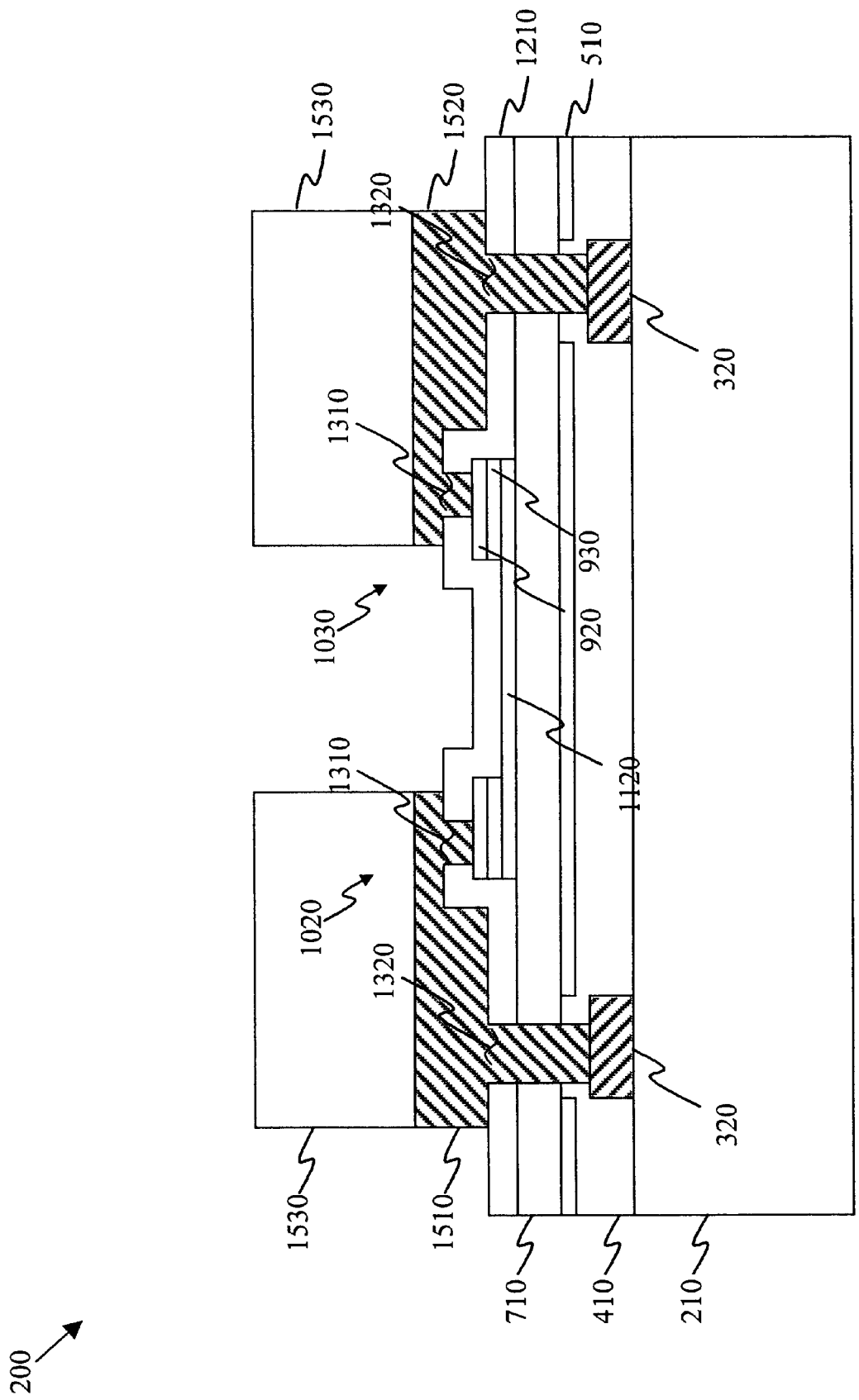
FIG. 15 illustrates the patterning and etching of the blanket metal layer, resulting with a first interconnect and a second interconnect.

Turning to FIG. 15, illustrated is the patterning and etching of the blanket metal layer 1410, resulting with a first interconnect 1510 and a second interconnect 1520. To form the first interconnect 1510 and second interconnect 1520, a layer of photoresist may be deposited, patterned and developed leaving photoresist portions 1530 protecting areas of the blanket metal layer 1410 that is desired to remain. The unprotected areas are then subjected to a traditional metal etch, resulting in the first interconnect 1510 and the second interconnect 1520. It is this traditional metal etch that the resistive layer 1120 should not come into contact with. In the illustrative embodiment the first interconnect 1510 contacts the first contact pad 1020 and one interconnect metallization structure 320, and the second interconnect 1520 contacts the second contact pad 1030 and the other interconnect metallization structure 320. After completion of the interconnects 1510, 1520, the photoresist portion 1530 may be removed, resulting in the completed thin film resistor device 100, illustrated in FIG. 1.

Figure 16:
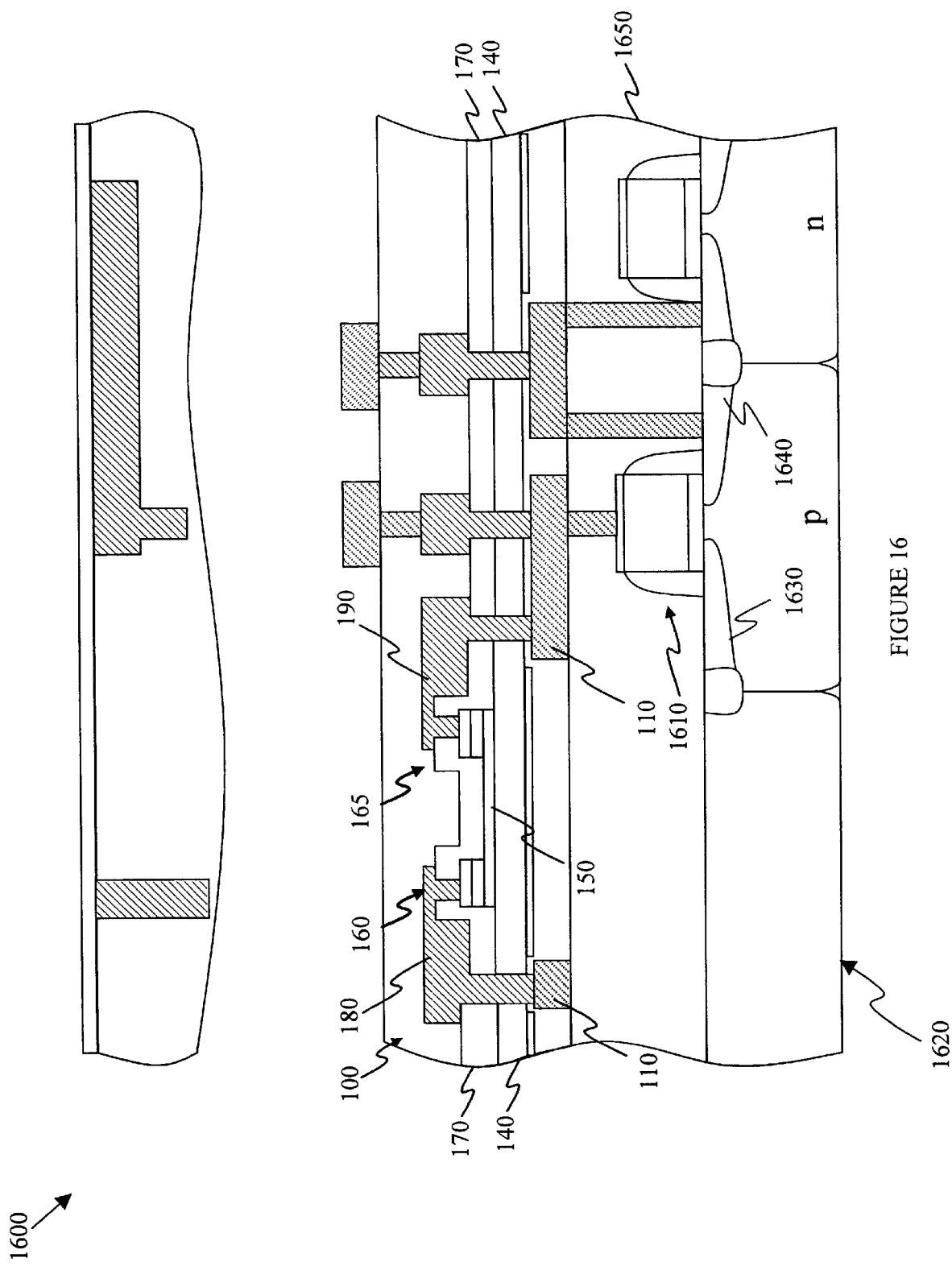
FIG. 16 illustrates an integrated circuit, which is one embodiment where the present invention may be used.

Turning now to FIG. 16, there is illustrated an integrated circuit 1600, which may be one embodiment with which the present invention may be used. The integrated circuit 1600 may include complementary metal oxide semiconductor (CMOS) devices, bipolar devices, bipolar CMOS (BiCMOS) devices or any other type of similar device. Also shown in FIG. 16, are components of the conventional integrated circuit 1600, including: a transistor 1610, a semiconductor wafer substrate 1620, a source region 1630, a drain region 1640, and a dielectric layer 1650. Moreover, the integrated circuit 1600 contains the thin film transistor device 100, including: the interconnect metallization structures 110, the first dielectric layer 140, the resistive layer 150, the first and second contact pads 160, 165, the second dielectric layer 170 and the first and second interconnects 180, 190. The interconnect structures 110, 180, 190, located within the dielectric layers 1650, 140, 170, electrically connect the transistors 1610 and the thin film resistor device 100 to form the integrated circuit 1600. As is known to those who are skilled in the art, each level of the integrated circuit 500 may be sequentially formed to the designed number of levels of the integrated circuit 1600. The present invention is not limited to the number of interconnect or dielectric levels shown, nor is the invention limited to the location of the thin film resistor device 100 within the integrated circuit 1600.

Although the present invention has been described in detail, hose skilled in the art should understand that they can make various changes, substitutions and alterations herein without departing from the spirit and scope of the invention in its broadest form.

What is claimed is:

1. A thin film resistor device, comprising:
   a resistive layer located on a first dielectric layer;
   first and second contact pads located on the resistive layer, wherein the first and second contact pads are not plugs;
   a second dielectric layer located on at least a portion of the resistive layer and on at least a portion of a horizontal surface of the first or second contact pads;
   a first interconnect that contacts the first contact pad and a second interconnect that contacts the second contact pad; and
   interconnect metallization structures wherein the first dielectric layer is located between the interconnect metallization structure and the resistive layer.

2. The thin film resistor as recited in claim 1 wherein each of the first and second interconnects contact an interconnect metallization structure.

3. The thin film resistor as recited in claim 1 wherein the first and second contact pads each have a width that is about 3000 nm greater than a width of at least one of the first and second interconnects.

4. The thin film resistor as recited in claim 1 wherein the first and second interconnects comprise aluminum.

5. The thin film resistor as recited in claim 4 wherein the first and second interconnects comprise a titanium/titanium nitride/aluminum/titanium nitride stack.

6. The thin film resistor as recited in claim 1 wherein the resistive layer includes tantalum nitride.

7. The thin film resistor as recited in claim 6 wherein the resistive layer further includes tantalum pentoxide.

8. The thin film resistor as recited in claim 1 wherein the first and second contact pads comprise a titanium/platinum stack.

9. The thin film resistor as recited in claim 8 wherein the titanium/platinum stack includes titanium nitride located there between.

10. The thin film resistor as recited in claim 1 wherein the resistive layer has a thickness ranging from about 20 nm to about 80 nm.

11. A method of fabricating a thin film resistor device, comprising:
    forming a resistive layer on a first dielectric layer;
    forming first and second contact pads on the resistive layer, wherein the first and second contact pads are not plugs;
    forming a second dielectric layer on at least a portion of the resistive layer and on at least a portion of a horizontal surface of the first or second contact pads;
    forming a first interconnect that contacts the first contact pad and forming a second interconnect that contacts the second contact pad;

forming interconnect metallization structures wherein the first dielectric layer is formed between the interconnect metallization structure and the resistive layer.

12. The method as recited in claim 11 wherein forming the first and second interconnects includes forming the first and second interconnects contacting the interconnect metallization structure.

13. The method as recited in claim 11 wherein forming first and second contact pads includes forming first and second contact pads each have a width that is about 3000 nm greater than a width of at least one of the first and second interconnects.

14. The method as recited in claim 11 wherein forming the first and second interconnects includes forming first and second aluminum interconnects.

15. The method as recited in claim 14 wherein forming first and second aluminum interconnects includes forming first and second aluminum interconnects comprising a titanium/titanium nitride/aluminum/titanium nitride stack.

16. The method as recited in claim 11 wherein forming a resistive layer includes forming a tantalum nitride resistive layer.

17. The method as recited in claim 16 wherein forming a resistive layer further includes forming a tantalum pentoxide layer.

18. The method as recited in claim 11 wherein forming first and second contact pads includes forming first and second contact pads comprising a titanium/platinum stack.

19. The method as recited in claim 18 wherein forming first and second contact pads comprising a titanium/platinum stack includes forming first and second contact pads comprising a titanium/titanium nitride/platinum stack.

20. The method as recited in claim 11 wherein forming a resistive layer includes forming a resistive layer having a thickness ranging from about 20 nm to about 80 nm.

21. The thin film resistor as recited in claim 1 wherein the thin film resistor forms part of an integrated circuit, and the integrated circuit includes transistors interconnected by interconnects.

22. A thin film resistor device, comprising:
a resistive layer located on a first dielectric layer;
first and second contact pads located on the resistive layer, wherein the first and second contact pads are not plugs and each comprise titanium/platinum stacks; and
a second dielectric layer located on at least a portion of the resistive layer and on at least a portion of a horizontal surface of the first or second contact pads.

23. The thin film resistor as recited in claim 22 further including a first interconnect that contacts the first contact pad and a second interconnect that contacts the second contact pad.

24. The thin film resistor as recited in claim 23 further including interconnect metallization structures wherein the first dielectric layer is located between the interconnect metallization structure and the resistive layer.

25. The thin film resistor as recited in claim 22 wherein the resistive layer includes tantalum nitride.

26. The thin film resistor as recited in claim 25 wherein the resistive layer further includes tantalum pentoxide.

27. The thin film resistor as recited in claim 22 wherein the titanium/platinum stack includes titanium nitride located there between.

28. The thin film resistor as recited in claim 22 wherein the resistive layer ranging from about 20 nm to about 80 nm.

* * * * *